US012699328B2

(12) United States Patent     (10) Patent No.:   US 12,699,328 B2

Levy et al.         (45) Date of Patent:     Aug. 4, 2026

(54) UTILITY STAGE FOR PHOTOLITHOGRAPHIC APPARATUS AND METHOD

(71) Applicant: ASML Netherlands B.V., Veldhoven (NL)

(72) Inventors: Keane Michael Levy, Wilton, CT (US); Amy Ng, Ridgefield, CT (US)

(73) Assignee: ASML Netherlands B.V., Veldhoven (NL)

( * ) Notice: Subject to any disclaimer, the term of this patent is extended or adjusted under 35 U.S.C. 154(b) by 83 days.

(21) Appl. No.: 18/703,797

(22) PCT Filed: Oct. 20, 2022

(86) PCT No.: PCT/EP2022/079327
§ 371 (c)(1),
(2) Date: Apr. 23, 2024

(87) PCT Pub. No.: WO2023/083582
PCT Pub. Date: May 19, 2023

(65) Prior Publication Data

US 2025/0021024 A1     Jan. 16, 2025

Related U.S. Application Data

(60) Provisional application No. 63/277,689, filed on Nov. 10, 2021.

(51) Int. Cl.
*G03F 7/00*       (2006.01)
*B25J 18/02*      (2006.01)

(52) U.S. Cl.
CPC .......... *G03F 7/70808* (2013.01); *B25J 18/02* (2013.01); *G03F 7/70716* (2013.01); *G03F 7/70925* (2013.01)

(58) Field of Classification Search
CPC .. G03F 7/707; G03F 7/70716; G03F 7/70725; G03F 7/70808; G03F 7/70841;
(Continued)

(56) References Cited

U.S. PATENT DOCUMENTS 5,559,582 A    9/1996   Nishi et al.
5,825,470 A   10/1998   Miyai et al.
(Continued)

FOREIGN PATENT DOCUMENTS

WO     2021063722 A1    4/2021
WO     2021089320 A1    5/2021

OTHER PUBLICATIONS

Jens Weckesser, European International Searching Authority, International Search Report and Written Opinion, counterpart PCT Application PCT/EP2022/079327, mailed Feb. 7, 2023, 11 total pages.

*Primary Examiner* — Peter B Kim
(74) *Attorney, Agent, or Firm* — DiBerardino McGovern IP Group LLC

(57) ABSTRACT

Disclosed is an apparatus for and method of using an in-system utility stage to provide service functions for wafer tables and other components in the photolithographic system in which the utility stage can access multiple tools without any need to open an enclosure containing the utility stage and the wafer tables and other components thus increasing throughput and decreasing downtime.

14 Claims, 10 Drawing Sheets

(58) Field of Classification Search
CPC .... G03F 7/70925; G03F 7/70975; B25J 18/02
See application file for complete search history.

(56) References Cited

U.S. PATENT DOCUMENTS

| | | | |
|---|---|---|---|
| 8,810,777 B2 | 8/2014 | Cadee et al. | |
| 9,355,200 B2 | 5/2016 | Chen et al. | |
| 2002/0012112 A1* | 1/2002 | Yamada ................. | G03F 7/707 |
| | | | 355/72 |
| 2005/0028314 A1* | 2/2005 | Hickman .......... | H01L 21/67028 |
| | | | 15/302 |
| 2006/0132733 A1 | 6/2006 | Modderman | |
| 2006/0162739 A1 | 7/2006 | Sogard | |
| 2008/0138177 A1 | 6/2008 | Klomp et al. | |
| 2021/0053177 A1 | 2/2021 | Scholten et al. | |
| 2022/0012112 A1 | 1/2022 | Wouhaybi et al. | |

* cited by examiner

UTILITY STAGE FOR PHOTOLITHOGRAPHIC APPARATUS AND METHOD

CROSS-REFERENCE TO RELATED APPLICATIONS

This application claims priority of U.S. Provisional Patent Application No. 63/277,689, which was filed on Nov. 10, 2021, and which is incorporated herein in its entirety by reference.

FIELD

The present disclosed subject matter relates to integrated circuit photolithographic manufacturing processes.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which may be a mask or a reticle, may be used to generate a circuit pattern to be formed on an individual layer of the IC. This pattern can be transferred onto a target portion (e.g. including part of, one or several dies) on a substrate (e.g. a silicon wafer).

Transfer of the pattern is typically accomplished by imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the scanning direction) while synchronously scanning the substrate parallel or anti parallel to this direction. It is also possible to transfer the pattern from the patterning device to the substrate by imprinting the pattern onto the substrate.

Generally, a substrate will be supported by a substrate holder called a wafer table while the substrate is being irradiated. The substrate may be held in the wafer table with an electrostatic chuck. The substrate holder can be provided with support elements which minimize the contact area between the substrate and the substrate holder. The support elements on the surface of the substrate holder may be referred to as burls or protrusions. The support elements are generally regularly spaced (e.g. in a uniform array) and of uniform height and define a very flat overall support surface on which the substrate can be positioned.

The support elements generally extend substantially perpendicularly from a surface of the substrate holder. In operation, the backside of the substrate is supported on the support elements, at a small distance from a main body surface of the substrate holder, in a position substantially perpendicular to the direction of propagation of the projection beam. Thus, the tops of the support elements (i.e. support surfaces), rather than the main body surface of the substrate holder, define an effective support surface for the substrate.

In order to avoid overlay errors during projection of a patterned beam of radiation on a substrate, it is desirable that the substrate top surface be flat. Unevenness of the supporting surfaces of the substrate support may lead to an uneven top surface of the substrate. Therefore, it is desirable to avoid unevenness in the substrate support.

Unevenness of the supporting surfaces can be caused by dissimilarity between the heights of material that makes up the support elements themselves. This is typically the case when a new substrate holder has been manufactured. Unevenness may be the result of differences between the heights of the support elements, or in the backside of the substrate holder. Therefore these elements are carefully made level. Nevertheless it has been found that unevenness may also result when the substrate table (and any other elements) are assembled or installed. Similar problems may be encountered with holders for other articles that have to be supported in a well-defined plane across the beam path, such as reflective patterning devices or transmission patterning devices.

Another cause of unevenness in the surface supporting the wafer is contamination in the form of particles on lithography tool wafer tables that can cause "hot spots"-areas on the wafer that are not flat against the chuck of the wafer table because of the particles trapped between the wafer and the wafer table. As mentioned, wafers processed through the stepper are clamped electrostatically to the wafer table. Because of this, the presence of particles on the wafer backside will locally deform the front surface of the wafer resulting in unevenness as described above (part of front surface locally out of focus). Contamination of the wafer table can result in a machine downtime of several days.

The normal procedure to remove unevenness is to take the tool offline and either open it to clean the wafer table, or to "stone" the wafer table with a tool to break down or remove the particles, or to otherwise restore planarity to the wafer support surface. Both procedures may interrupt critical tool availability for hours. These uneven areas are conventionally removed by grinding the surface of the wafer table with a disc made of an abrasive material to flatten the surface or remove contaminants. The abrasive material can be, for example, granite or ceramic. The use of materials such as granite has led to these discs of abrasive material being referred to as "stones" and to the procedure as "stoning."

Some lithography machines have dual chucks which respectively move two wafers simultaneously. While one wafer is being exposed, the position of the other wafer is measured by the machine's metrology sensors. Some lithography tools have automated measurement capabilities that identify hot spots and shut down the tool until the cause of the hot spots is addressed.

Also, some tools have an automatic chuck cleaner option in which a cleaning stone in a holder under the scanner frame cleans a chuck as it moves underneath the stone. Use of such technology can reduce the time required to clean a single spot to about one minute and the whole chuck to about twenty minutes. In comparison, manually cleaning a hot spot from tool down to tool up takes 1-3 hours.

Even though these technologies have greatly enhanced throughput, it is still the case that the enclosure containing the wafer table(s) must be opened if it is desired to use a stone other than a currently installed stone. This results in a prolonged downtime. It may be possible to obtain even greater throughput advantages if the stones could be exchanged without having to open the enclosure containing the wafer table(s). This applies to other operations which would normally require the enclosure to be opened. It is in this context that the need for the presently disclosed subject matter arises.

SUMMARY

The following presents a concise summary of one or more embodiments in order to provide a basic understanding of the present invention. This summary is not an extensive overview of all contemplated embodiments and is not intended to identify key or critical elements of all embodiments nor delineate the scope of any or all embodiments. Its sole purpose is to present some concepts relating to one or more embodiments in a succinct form as a prelude to the more detailed description that is presented later.

According to one aspect of an embodiment, an arrangement enables in situ substitution of tools such as stones by having an "in-system" utility stage designed to transport objects in addition to wafers for processing. Here and elsewhere, the term "in-system" is used to mean that the device or function referred to is one that operates without having to open an enclosure containing the wafer tables. According to another aspect of an embodiment, a variety of tools may be stored in-system in a tool store, with the utility stage being capable of retrieving tools from the tool store and loading the tools into a utility device such as an in-system cleaner.

In accordance with another aspect of an embodiment there is disclosed a photolithographic apparatus comprising an enclosure and at least one object table situated in the enclosure and adapted to travel between a plurality of positions in the enclosure. The photolithographic apparatus also includes a utility device situated within the enclosure in a utility zone and a utility stage situated in the enclosure and adapted to travel from a parked position to the utility zone, the utility stage being adapted to carry at least one tool from the parked position to the utility zone.

The photolithographic apparatus may further comprise a tool store situated in the enclosure adjacent to the parked position and a plurality of tools stored in the tool store wherein the utility stage is adapted to unload a first tool from the tool store, convey the first tool to the utility device, and load the first tool on the utility device. The object table may comprise a wafer table, utility device may comprise a wafer table cleaning tool situated at the utility position, and the first tool may comprise a first cleaning stone.

The utility stage may be further adapted to unload the first tool from the utility device, convey the first tool to the tool store, and load the first tool in the tool store. The at least one object table may comprise a first wafer table and a second wafer table. The utility stage may comprise an extensible robotic arm arranged to position the utility stage.

According to another aspect of an embodiment there is disclosed a photolithographic apparatus comprising an enclosure and a first wafer table situated in the enclosure and adapted to move between a plurality of coplanar positions in the enclosure, including a load position at which a first wafer handler loads a wafer of semiconductor material onto the first wafer table, a measurement position at which a wafer on the first wafer table can be measured, an exposure position at which a wafer on the first wafer table can be exposed to patterning radiation, and a load position at which a wafer on the first wafer table is unloaded by a second wafer handler. The enclosure also contains a second wafer table adapted to move between a plurality of coplanar positions in the enclosure, including a load position at which a first wafer handler loads a wafer of semiconductor material onto the second wafer table, a measurement position at which a wafer on the second wafer table can be measured, an exposure position at which a wafer on the second wafer table can be exposed to patterning radiation, and a load position at which a wafer on the second wafer table is unloaded by a second wafer handler, the second wafer table being moved in such a way as to avoid interfering with motion of the first wafer table and the first wafer table being moved in such a way as to avoid interfering with motion of the second wafer table.

The enclosure also contains a utility device positioned in a utility zone and adapted to perform a utility operation on a wafer and a utility stage situated in the enclosure and adapted to travel from a parked position to the utility zone, the utility stage being adapted to carry at least one tool from the parked position to the utility zone, the utility stage being moved and positioned in such a way as to avoid interfering with motion of the first wafer table and the second wafer table.

The photolithographic apparatus may further comprise a tool store situated in the enclosure adjacent to the parked position and a plurality of tools stored in the tool store wherein the utility stage is adapted to unload a first tool from the tool store, convey the first tool to the utility device, and load the first tool on the utility device. The utility device may comprise a wafer table cleaning tool situated in the utility zone and the first tool comprises a first cleaning stone. The plurality of tools stored in the tool store may comprise a plurality of cleaning stones.

The first tool may comprise a sticky wafer and the utility device may comprise a wafer table cleaning tool adapted to press the sticky wafer against a wafer receiving surface of a wafer table. The first tool may comprise a spiked wafer and wherein the utility device comprises a wafer table cleaning tool adapted to press the spiked wafer against a wafer receiving surface of a wafer table.

The utility stage may be further adapted to unload the first tool from the utility device, convey the first tool to the tool store, and load the first tool in the tool store. The utility stage may comprise an extensible robotic arm.

According to another aspect of an embodiment there is disclosed a method of operating a photolithographic apparatus, the photolithographic apparatus comprising an enclosure, a first wafer table situated in the enclosure and adapted to move between a plurality of coplanar positions in the enclosure, a second wafer table situated in the enclosure and adapted to between a plurality of coplanar positions in the enclosure, a utility device situated within the enclosure in a utility zone and adapted to perform a utility operation on a wafer, and a utility stage situated in the enclosure and adapted to travel from a parked position to the utility zone, the utility stage being adapted to carry at least one tool from the parked position to the utility zone, the method comprising situating the first wafer table at a first neutral position at which the first wafer table will not interfere with motion of the utility stage from the parked position to the utility zone, situating the second wafer table at a second neutral position at which the second wafer table will not interfere with motion of the utility stage from the parked position to the utility zone, and moving the utility stage from the parked position to the utility device utility zone.

The utility stage may unload a tool from a tool store when the utility stage is at the parked position. The first tool may be one of a plurality of tools stored in the tool store. The utility stage may load a tool onto a utility device when the utility stage is in the utility zone. The utility stage may unload a tool from the tool store when the utility stage is at the parked position, move to the utility zone, and load the tool onto a utility device in the utility zone.

The method may further comprise using the utility stage to unload a first tool from the utility stage in the utility zone, moving the utility stage to the parked position, unloading the first tool from the utility stage, and loading the first tool in a tool store, unloading a second tool from the tool store, and loading the second tool on the utility stage, moving the utility stage to the utility zone, and using the utility stage to load the second tool onto the utility device.

The utility device may comprise a wafer table cleaning tool situated in the utility zone and the first tool may comprise a first cleaning stone. The first tool may comprise a sticky wafer and the utility device may comprise a wafer table cleaning tool adapted to press the sticky wafer against a wafer receiving surface of a wafer table.

The first tool may comprise a spiked wafer and the utility device may comprise a wafer table cleaning tool adapted to press the spiked wafer against a wafer receiving surface of a wafer table.

The photolithographic apparatus may comprise a lens and the first tool may comprise a lens cleaning device, and the utility stage may be adapted to travel to the lens and deploy the lens cleaning device to clean the lens.

Further embodiments, features, and advantages of the subject matter of the present disclosure, as well as the structure and operation of the various embodiments are described in detail below with reference to accompanying drawings.

Further features and advantages of the disclosed subject matter, as well as the structure and operation of various embodiments of the disclosed subject matter, are described in detail below with reference to the accompanying drawings. It is noted that the applicability of the disclosed subject matter is not limited to the specific embodiments described herein. Such embodiments are presented herein for illustrative purposes only. Additional embodiments will be apparent to persons skilled in the relevant art based on the teachings contained herein.

DETAILED DESCRIPTION

Various embodiments are now described with reference to the drawings. In the following description, for purposes of explanation, numerous specific details are set forth in order to promote a thorough understanding of one or more embodiments. It may be evident in some or all instances, however, that any embodiment described below can be implemented or practiced without adopting the specific design details described below. In other instances, well-known structures and devices are shown in block diagram form in order to facilitate description of one or more embodiments. This summary is not an extensive overview of all contemplated embodiments and is not intended to identify key or critical elements of all embodiments nor delineate the scope of any or all embodiments.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals (e.g., carrier waves, infrared signals, digital signals, etc.), and others. Further, firmware, software, routines, and instructions may be described herein as performing certain actions or causing certain actions to be performed. However, it should be appreciated that such descriptions are merely for convenience and that such actions in fact result from computing devices, processors, controllers, or other devices executing the firmware, software, routines, instructions, etc.

Figure 1:
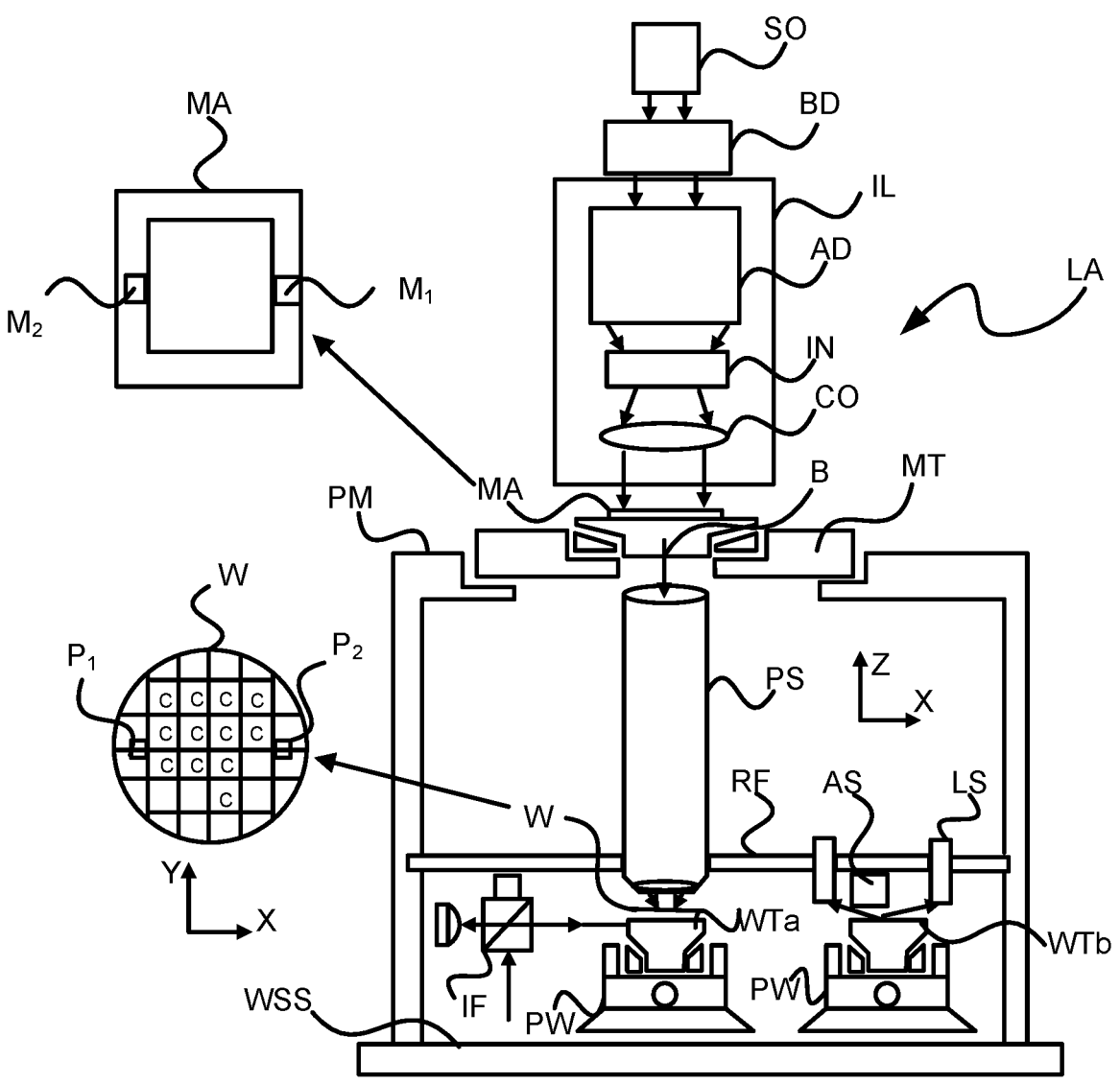
FIG. 1 shows a schematic, not to scale, view of an overall broad conception of a photolithography system.

As an introduction, FIG. 1 schematically depicts an embodiment of a lithographic apparatus LA that may be included in and/or associated with the present systems and/or methods. The lithographic apparatus LA comprises an illumination system (illuminator) IL configured to condition a radiation beam B. The terms "radiation" and "beam" used herein encompass all types of electromagnetic radiation, including ultraviolet (UV) or deep ultraviolet (DUV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The lithographic apparatus LA also comprises a support structure (e.g. a mask table) MT constructed to support a patterning device (e.g. a mask) MA and connected to a first positioner PM configured to accurately position the patterning device in accordance with certain parameters; one or more substrate tables (e.g. a wafer tables) WT (in the example, two wafer tables, WTa and WTb) configured to hold a substrate (e.g. a resist-coated wafer) W. Each wafer table is mechanically coupled to a respective positioner PW configured to accurately position the substrate on a wafer support surface WSS in accordance with certain parameters. As used herein, either the mask table or the wafer table may be considered an object table.

The lithographic apparatus LA also comprises a projection system (e.g. a refractive projection lens system) PS configured to project a pattern imparted to the radiation beam B by patterning device MA onto a target portion C (e.g. comprising one or more dies and often referred to as fields) of the substrate W. The projection system is supported on a reference frame RF.

As depicted, the apparatus is of a transmissive type (e.g. employing a transmissive mask). Alternatively, the apparatus may be of a reflective type (e.g. employing a programmable mirror array of a type as referred to above or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases, the source may be an integral part of the apparatus, for example when the source is a mercury lamp. The source SO and the illuminator IL, together with the beam delivery system BD if required, may be referred to as a radiation system. If the radiation source is of the type that produces EUV radiation then generally reflective optics will be used.

The illuminator IL may comprise adjuster AD configured to adjust the (angular/spatial) intensity distribution of the beam. In addition, the illuminator IL generally comprises various other components, such as an integrator IN and a condenser CO. The illumination system may include various types of optical components for directing, shaping, or controlling radiation. Thus, the illuminator IL provides a conditioned beam of radiation B, having a desired uniformity and intensity distribution in its cross section.

The support structure MT supports the patterning device MA using mechanical, vacuum, electrostatic or other clamping techniques to hold the patterning device. The term "patterning device" used herein should be broadly interpreted as referring to any device that can be used to impart a pattern in a target portion of the substrate. As mentioned, the patterning device Ma may be transmissive or reflective. Examples of patterning devices include masks, programmable mirror arrays, and programmable LCD panels.

The lithographic apparatus may be of a type having two or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines, the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, to fill a space between the projection system and the substrate.

In operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the patterned radiation beam B passes through the projection system PS, which focuses the beam onto a target portion C of the substrate W. With the aid of its respective positioner PW and position sensor IF (e.g. an interferometric device, linear encoder, 2-D encoder, or capacitive sensor), the wafer table WTa or WTb can be moved accurately, e.g. to position different target portions C in the path of the radiation beam B. Similarly, another positioner 305 and another position sensor (which is not explicitly depicted in FIG. 1) can be used to accurately position the patterning device MA with respect to the path of the radiation beam B, e.g. after mechanical retrieval from a mask library, or during a scan.

Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already includes one or more processed layers.

Figure 2:
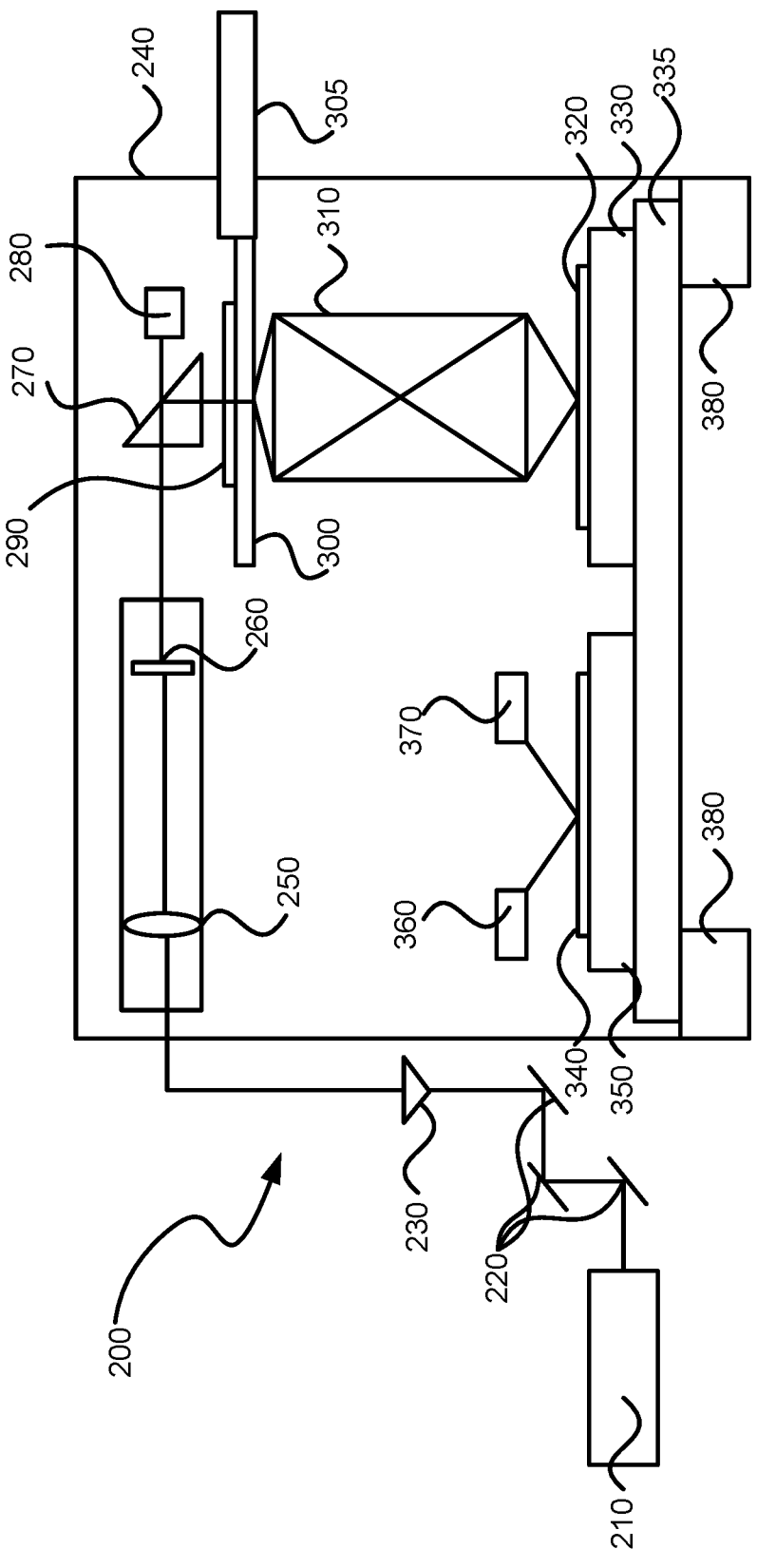
FIG. 2 is a schematic, not to scale, view of an overall broad conception of a wafer transport system for a photolithography system.

FIG. 2 is a more detailed conceptual diagram of a dual wafer table scanner 200. A laser 210 generates a beam of radiation. One or more beam correctors 220 (three in the example of FIG. 2) correct the incident direction of the beam. An energy controller 230 controls the energy ultimately reaching the silicon wafers 320, 340.

The beam enters an enclosure 240 supported by shock absorbers 380 which isolate the interior of the enclosure 240 to reduce interference from external vibrations. In the enclosure 240 the beam is acted upon by a beam shaper 250 which sets the beam to different shapes, such as a circle, ring, and so on. The beam then encounters a shutter device 260 that prevents the beam from shining onto the wafers 320, 340 when no exposure is required. The beam is then split by a beam splitter 270 which directs a portion of the beam to an energy detector 280 which detects whether the final incident energy of the beam meets the exposure requirements of a current process recipe and provides feedback to the energy controller for adjustment.

The other portion of the beam is directed to a mask 290 positioned on a reticle stage 300 that controls the position and motion of the mask 290. The mask 290 patterns the beam and the patterned beam then passes through an objective 310 that compensates for optical errors and proportionally reduces the pattern. The beam then reaches a silicon wafer 320 covered with a photoresist which transfers the pattern in the beam to the surface of the silicon wafer 320. The silicon wafer 320 is positioned atop a first wafer table 330 which positions and moves the wafer 320 across a substrate support surface 335. The wafer tables 330, 350 may or may not come into physical contact with the substrate support surface 335.

If the scanner 200 is of the type which has dual wafer tables, as it is in this example, then a second wafer 340 may positioned on a second wafer table 350. At the part of the operation depicted in FIG. 2 the second wafer 340 is positioned to be measured by measuring devices 360, 370.

Figure 3A:
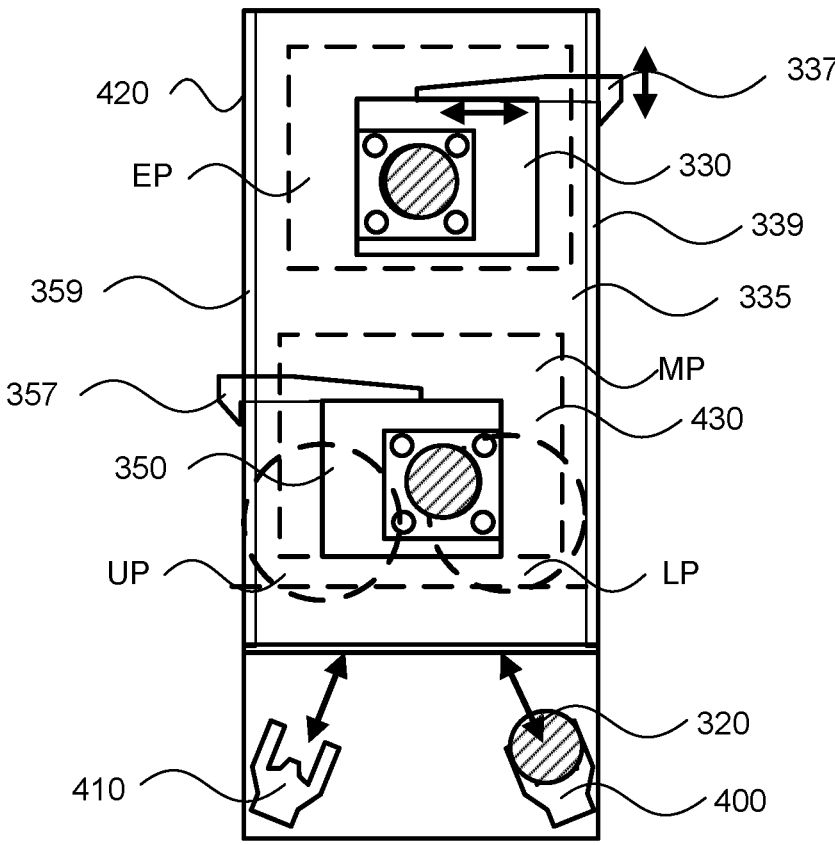
FIG. 3A is a diagrammatic plan view, not to scale, of a wafer transport system for a photolithography system in a first configuration.

FIG. 3A is a schematic plan view of the substrate support surface 335 showing two wafer tables 330 and 350 and wafer handlers 400 and 410 for loading and unloading wafers such as a wafer 320. As suggested by the horizontal and vertical arrows, each wafer table can move horizontally and vertically in the plane of the figure. More specifically, each wafer table is connected to an arm with wafer table 330 being connected to an arm 337 and wafer table 350 being connected to an arm 357. Each wafer table can move horizontally along the length of its arm to access positions across the width of the substrate support surface 335. Each arm is connected to a respective rail, arm 337 to rail 339 and arm 357 to rail 359. The rails permit their respective arms/wafer tables to move vertically in the plane of the figure to various positions along the length of the substrate support surface 335. In the configuration of FIG. 3A the wafer table 330 is positioned at an exposure position EP at which the wafer can be exposed to patterning radiation. The wafer table 350 is situated at a measurement position MP at which the alignment and so forth of the wafer may be checked.

FIG. 3A also shows wafer handlers 400 configured as a wafer loader and arranged to load wafers onto the wafer tables and the wafer handler 410 configured as a wafer extractor and be arranged to remove wafers from the wafer tables. As shown, the wafer handlers 400 can be extended to reach a wafer loading position LP and the wafer handler 410 can be extended to reach a wafer unloading position UP as indicated by the slanted arrows.

Figure 3B:
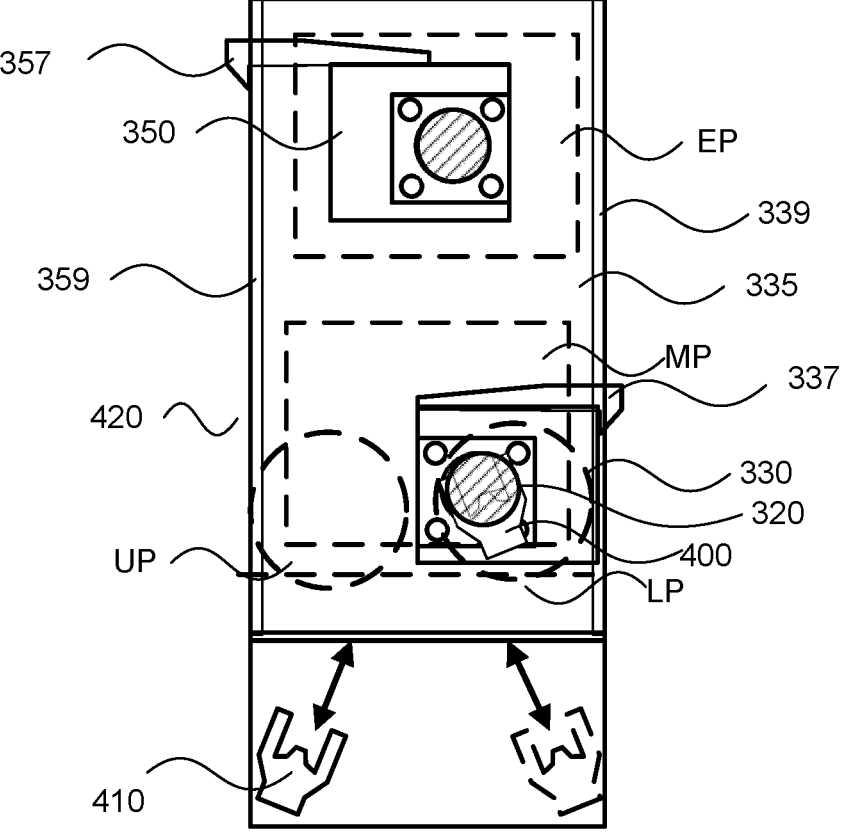
FIG. 3B is a diagrammatic plan view, not to scale, of a wafer transport system for a photolithography system in a second configuration.

FIG. 3B shows a configuration in which the wafer table 330 is moved to a load position LP at which the wafer handler 400 can load a wafer 320 on to the wafer table 330. Wafer table 350 can also reach this position. Laterally adjacent to the load position LP is an unload position UP, also reachable by either wafer table 330 and 350, at which the wafer handler 410 can unload a wafer from either of the wafer tables 330 and 340.

To recapitulate, the wafer handlers 400 and 410 are extensible and can be actuated to place a fresh wafer on one of the wafer tables 330, 350 or remove a processed wafer from one of the wafer tables 330, 350. Each wafer table 330, 350 can reach a load position LP, an unload position UP, a measurement position MP, and an exposure position EP.

As mentioned, a wafer top surface that is not flat can result in manufacturing defects. One cause of the surface of the wafer not being not being flat is particulate contaminants that have accumulated on the surface of the wafer support table. It is accordingly desirable to have the ability to periodically remove these contaminants. It is also desirable that this wafer table surface cleaning procedure can be conducted without having to open the enclosure which contains the wafer tables. Having to open the scanner can incur any downtime penalty on the order of hours or even days. Thus, there are systems which provide for in situ wafer table cleaning in which the wafer tables can be cleaned in system.

While such systems are effective in reducing machine downtime there are instances when it is desirable also to be able to change the stones that are being needed for a given cleaning or other abrading application without opening the enclosure. In other words, it may be desirable to use a stone having a different characteristic such as grade than the stone that is currently in the wafer table cleaning tool. Thus, in accordance with an aspect of an embodiment, a robotics utility stage is arranged to be able travel along parts of the wafer table support surface. This robotics utility stage can access a position of a wafer table cleaning device to swap out a current stone with a stone that is better suited for the desired wafer table maintenance operation.

In the following example, the use of this utility stage will be described as a third stage in a dual stage scanning system but it will be understood that the benefits of the invention may also be gained in a single stage scanning system. Also, although the description herein is in terms of the wafer handling systems, this is merely for the sake of having a specific example to promote clarity of the description. It is a nonlimiting example, and one of ordinary skill in the art will readily appreciate that the principles elucidated herein also apply to other parts of the photolithographic system which would benefit from the inclusion of a utility stage, such as the in-system robot, currently with two arms, that present masks or reticles to the reticle stage 300.

Figure 4A:
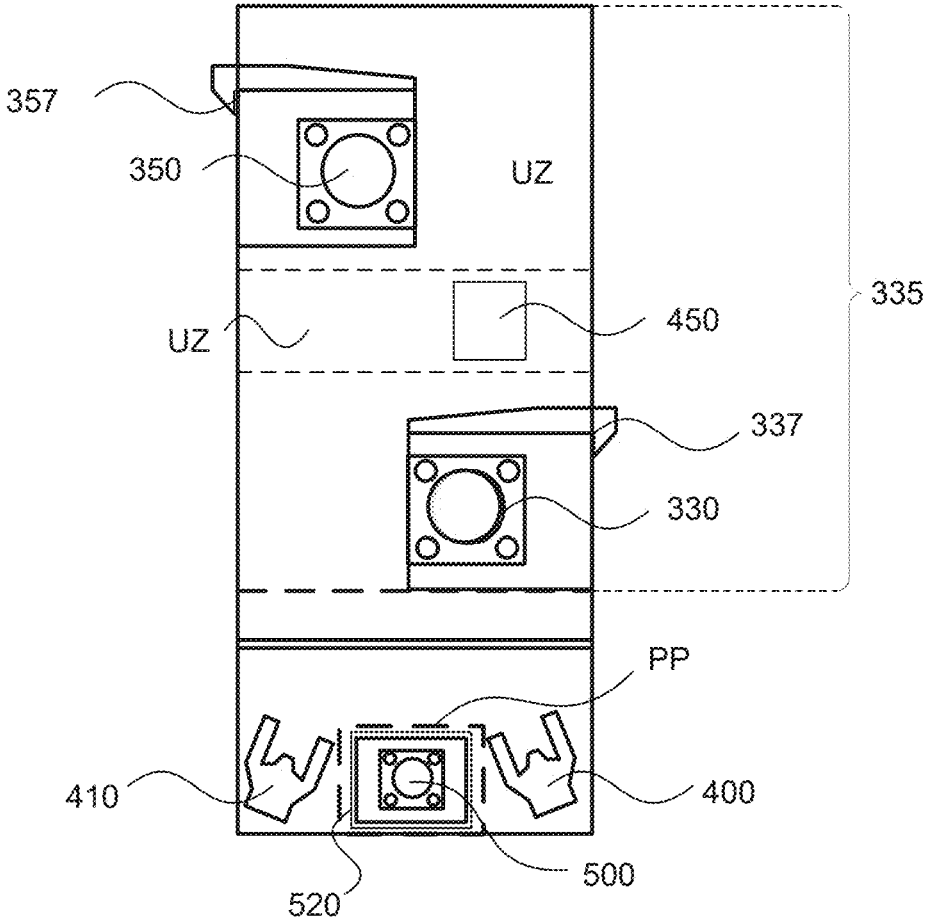
FIG. 4A is a diagrammatic plan view, not to scale, of a wafer transport system according to aspects of the disclosed subject matter in a first configuration.
Figures 4B, 4C:
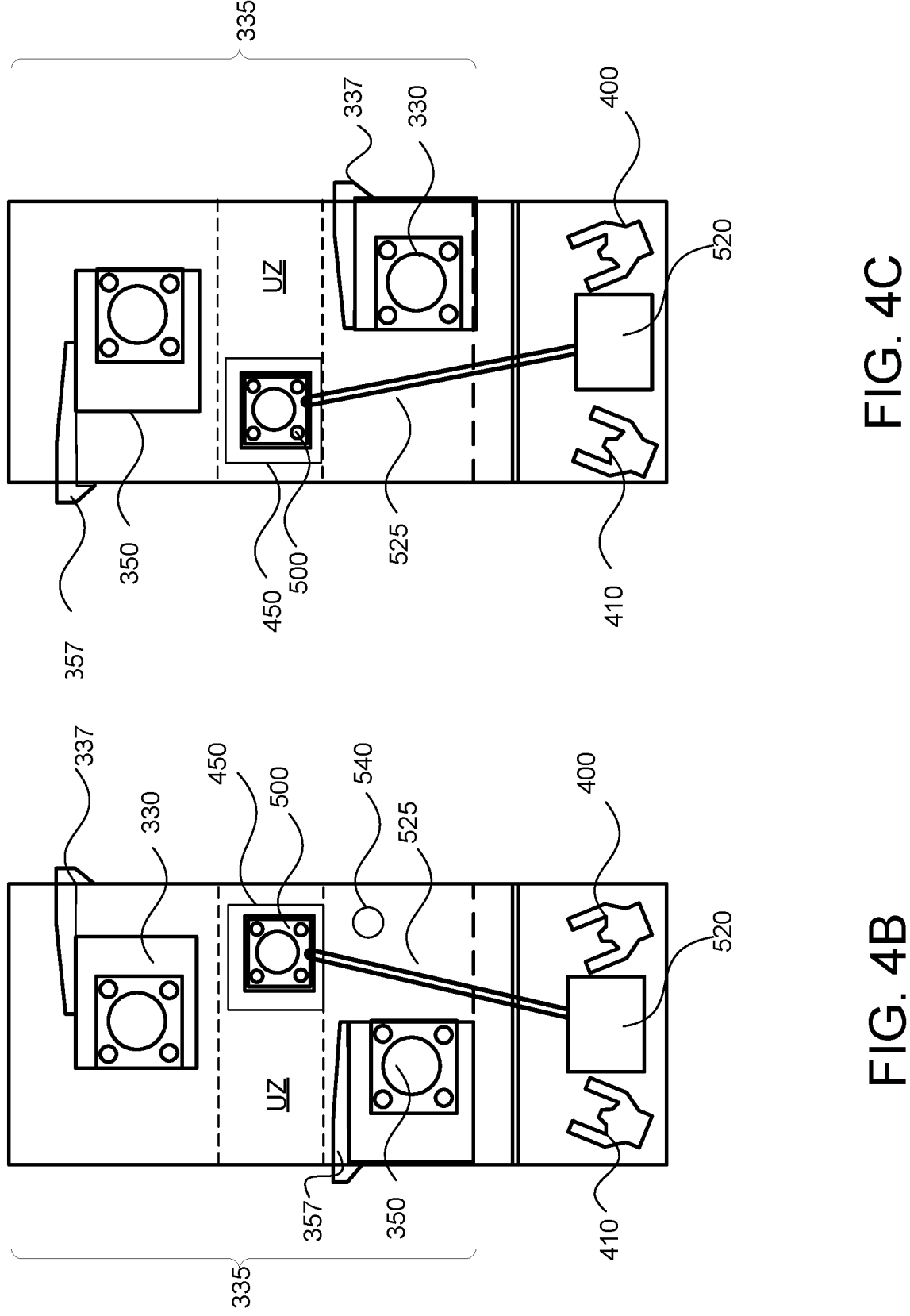
FIG. 4B is a diagrammatic plan view, not to scale, of a wafer transport system according to aspects of the disclosed subject matter in a second configuration.
FIG. 4C is a diagrammatic plan view, not to scale, of a wafer transport system according to aspects of the disclosed subject matter in a third configuration.

For example, in a dual scanning stage system a utility stage 500 may have a parked position PP between the two wafer handlers 400, 410 as shown in FIG. 4A. The utility stage 500 may then move to a vertically central portion of the substrate support surface 335 to a utility zone UZ having one or more utility devices 450 such as a cleaner while the wafer tables 330, 350 are in positions which do not interfere with the motion of the utility stage 500. For example, as shown in FIG. 4B, the utility stage 500 may assume a position on the right hand side of the substrate support surface 335 while wafer table 330 is in the exposure position and the wafer table 350 is in the loading position. The utility stage 500 may then also assume a vertically central position on the left hand side of the substrate support surface 335 when the wafer stages are the configuration shown in FIG. 4C. The utility stage 500 may be moved to various positions by an extensible robotic arm 525 as shown or may be moved by some other means.

As shown, the utility stage 500 in the parked position PP between the wafer handlers 400, 410 may have access to a tool store 520 such as a carousel or cassette which holds a variety of tools. According to one aspect of an embodiment, the tools may be stones of varying characteristics such as grit and composition. The utility stage 500 may swap a stone with the tool store 520 or obtain a stone from the tool store 520 if the utility stage 500 does not yet have a stone loaded on it, and then move to a position in which the utility stage 500 may exchange the stone it is carrying for one then currently in a cleaning station in the utility zone UZ. In this way the most appropriate stone can be used while avoiding opening the enclosure. The stones could be of any one of several types and varieties, including stones for cleaning, for burl top reconditioning, to improve flatness, to clean photoresist, to remove carbon contamination, and to imprint structures. For example, the stones may include two roughness stones, four flatness stones, and one photoresist cleaning stone. This could be stored in the tool store 520 with other cleaning tools such as SiO-etch treatment tools and/or an inter-burl-cleaning wand.

In general, although the description here is in terms of large format tools (i.e., designed to interact with an entire clamp or wafer) as an example, it will be appreciated that the concepts elucidated herein apply as well to smaller tools. For example, also shown in FIG. 4B is an optical component 540, for example, a lens. This may be an objective lens of a wafer alignment metrology unit. Over time, such lenses may become contaminated with material outgassed from the photoresist on the wafers. One of the tools the utility stage 500 may retrieve from the tool store 520 could be a lens cleaning device which the utility stage could convey to the lens and use to clean the lens.

Figure 5A:
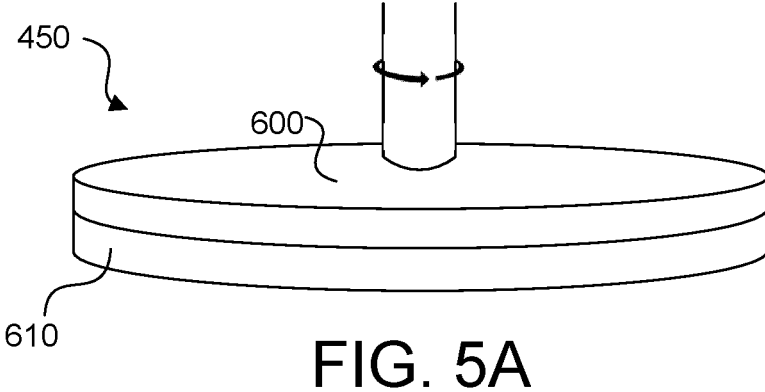
FIG. 5A is a perspective view of a cleaning tool used as a utility device according to aspects of the disclosed subject matter.
Figure 5B:
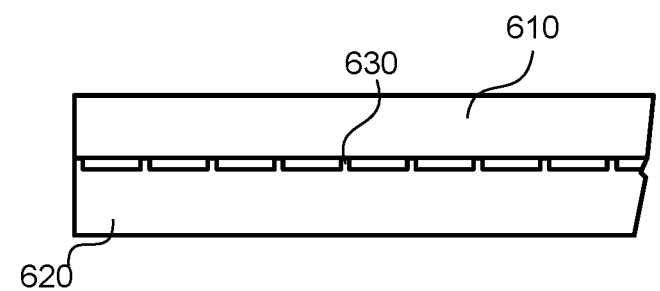
FIG. 5B is a cross sectional view of a cleaning tool used as a utility device according to aspects of the disclosed subject matter.

According to an aspect of an embodiment, as shown in FIG. 5A, the utility device 450 may be a cleaning station with an element 600 arranged to cause relative motion (rotational, reciprocating, or a combination) between a stone 610 and an upper surface (chuck) of a wafer table 620. As shown in FIG. 5B, the upper surface 620 may be provided with protrusions or burls 630 as described above, the upper surfaces of which define the contact surface with a wafer 610 placed on the wafer table 620. The element 600 may be situated in the utility zone UZ. The utility stage 500 can travel to the element 600 to unload the stone 610 and then exchange it for another stone in the tool store 520 which the utility stage 500 may then transport to and load onto the element 600.

Figure 5C:
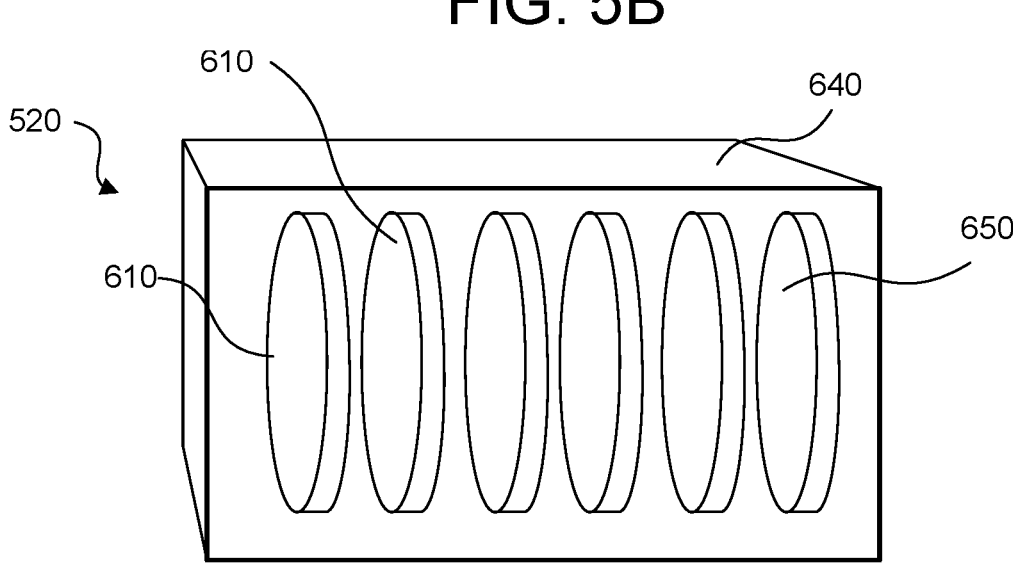
FIG. 5C is a partially perspective view of a tool store according to aspects of the disclosed subject matter.

The tool store 520 may take any one of several forms conducive to exchanging wafers with the utility stage 500. FIG. 5C shows one possible configuration in which the tools 610, in the example stones, are arranged adjacent one another in a cassette frame 640. Tool 650 could be one of the other types of tools mentioned above, e.g., flatness stones, photoresist cleaning stone, SiO-etch treatment tools, an inter-burl-cleaning wand, or a lens cleaner. It will be apparent to one of ordinary skill in the art that other tools, and other configurations for the tool store, are possible.

Figure 6A:
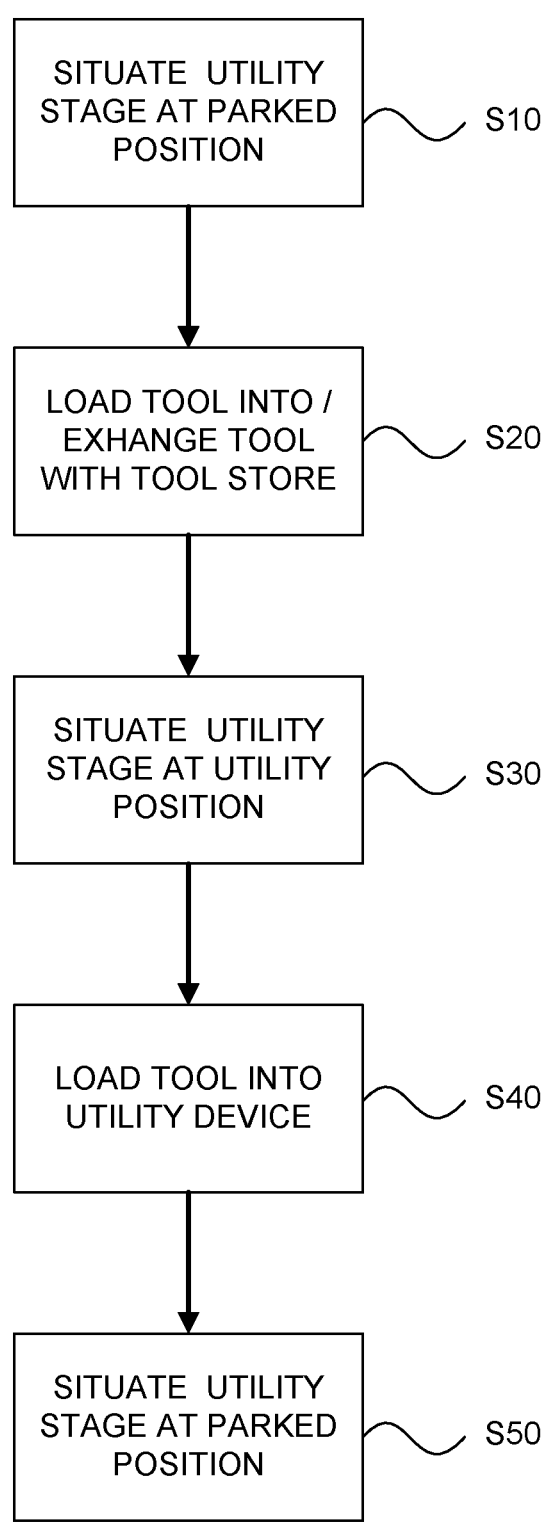
FIG. 6A is a flowchart describing certain aspects of a method of using a utility stage in a wafer transport system according to aspects of the disclosed subject matter.

According to another aspect of an embodiment there is disclosed a method of using an in-system utility stage. With reference now to FIG. 6A, in a step S10 the utility stage is situated at its parked position within an enclosure. The enclosure also contains one or more wafer tables. In a step S20 the utility stage loads a tool from a tool store also situated in the enclosure. If the utility stage already has a tool, then it exchanges that tool with the in-system tool store. In a step S30 the utility stage is situated at a utility position where a utility device such as, for example, a wafer table cleaning tool is also situated. In a step S40 the utility stage loads the tool into the utility device. In a step S50 the utility stage is returned to the parked position.

Figure 6B:
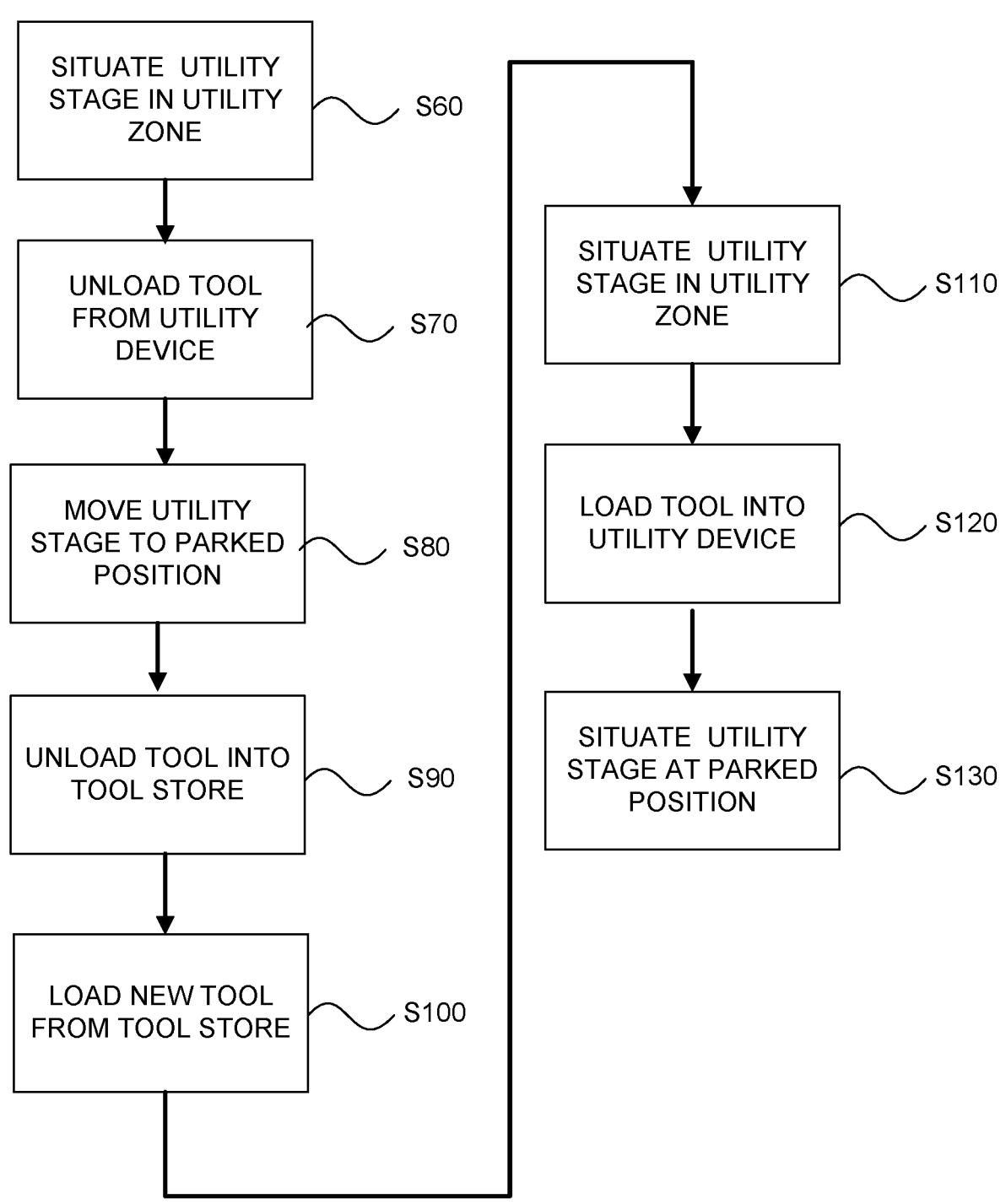
FIG. 6B is a flowchart describing certain aspects of a method of using a utility stage in a wafer transport system according to aspects of the disclosed subject matter.

Of course, if the utility device already has a tool loaded onto it, then the procedure just described is preceded by a series of steps in which the utility stage travels to the utility device, removes the tool, and places the tool in the tool store. Such a procedure is described in FIG. 6B. In a step S60 the utility stage is situated in the utility zone. In a step S70, the utility stage unloads the current tool from the utility device. In a step S80 the utility stage is moved to its parked position. In a step S90 the utility stage unloads or has unloaded the tool that it is carrying and stores it in the tool store. In a step S100 the utility stage loads a new tool from the tool store. In step S110, the utility stage is situated in the utility zone. In a step S120, the utility stage loads the new tool into the utility device. Then, in a step S130, the utility stage is resituated at its parked position.

Adding such a "third chuck" also allows the addition of in-system performance/calibration/maintenance functions to be added to the system. Thus, according to an aspect of an embodiment, the utility stage 500 can also carry as tools calibration samples loaded from the tool store 520. The utility stage 500 could also carry as tools instruments for inspecting the wafer tables 330, 350 for damaged burls. Thus tool 650 could be one of these tools.

The tool store 520 could be supplied when the enclosure is otherwise open with a specialty dummy wafer with a side at least partially coated with a sticky substance such as a reticle table cleaner (RTC) adhesive or a polyimide material, such a wafer being known as a sticky wafer, that the utility stage 500 could load, transport to, and transfer to a utility device which presses the sticky side of the sticky wafer against one of the wafer tables to collect particulate contaminants from the burl tops. Thus tool 650 could be one of these tools.

The tool store 520 could be supplied when the enclosure is otherwise open with another type of specialty dummy wafer with a spiked backside surface, known as a spiked wafer, which the utility stage 500 could load, transport to, and transfer to a utility device which presses the spiked wafer against one of the wafer tables to increase the roughness of the surface of the wafer table. Thus tool 650 could be one of these tools.

The tool store 520 could be supplied when the enclosure is otherwise open with an x-ray charge removal tool. The utility stage 500 could load the x-ray charge removal tool and transport and transfer it to a utility device which uses the x-ray charge removal tool to discharge EUV clamp surfaces to mitigate cycle-induced charging. Other tools that could be made available in the tool store 520 and which the utility stage 500 could transport and load onto a device to use it according to aspects of other embodiments include a laser cleaner to etch and remove large particle contamination, a camera for locating lost wafers, in-system burl inspection, and wafer alignment, additional alignment sensors, UV-ozone cleaners to clean, for example, carbon contamination from fiber carbon contamination, "sticky stick" particle removers which would prevent large particle contamination from impacting overlay, and a sticky stone for local inter-burl particle removal. Thus tool 650 could be one of these tools.

The utility stage 500 could also permit in-system wafer flipping so that no surface of the wafer transport system would come into contact with the chuck-facing side of the wafer other than the chuck itself. This would permit, for example, flipping the wafer only when it is at the chuck, to allow cleaning of just the wafer chuck, mitigating cross-contamination from other wafer contact points.

The utility stage 500 could also have access to burn-in tools such as covers to protect critical hardware such as lenses during flushing. The utility stage 500 could have access to long-term maintenance tools such as particle traps having high voltage electrodes for collecting particles and which can be changed in-system thus decreasing defectivity. Thus tool 650 could be one of these tools.

Incorporating a utility stage such as that just described may also facilitate extending the tool lifetime. For example, if only one stone were available, with no ability to swap stones, then, in general, that stone would be a cleaning stone adapted to perform a cleaning function. Performing a lifetime-extending operation such as flattening would require taking the machine offline and incurring a downtime penalty, which an operator would be inclined to do only minimally. Another potential use of a utility stage, however, could be to perform flatness reconditioning, specifically, flattening the circumferential edge of the chuck to restore flatness using a reconditioning stone which is better suited to that function (hard enough to wear away burls) than a cleaning stone. An operator would be more inclined to use such a tool if it is made conveniently available. Thus, being able to deploy a reconditioning stone in-system (without opening the enclosure) without incurring a machine downtime penalty can result in an increase in part lifetime. Similarly, a lens cleaning tool could be one of the tools the utility stage can load and use, so that the stage can access and clean a lens that gets contaminated over time due to photoresist on the wafer outgassing, again promoting extension of machine lifetime.

Figure 7:
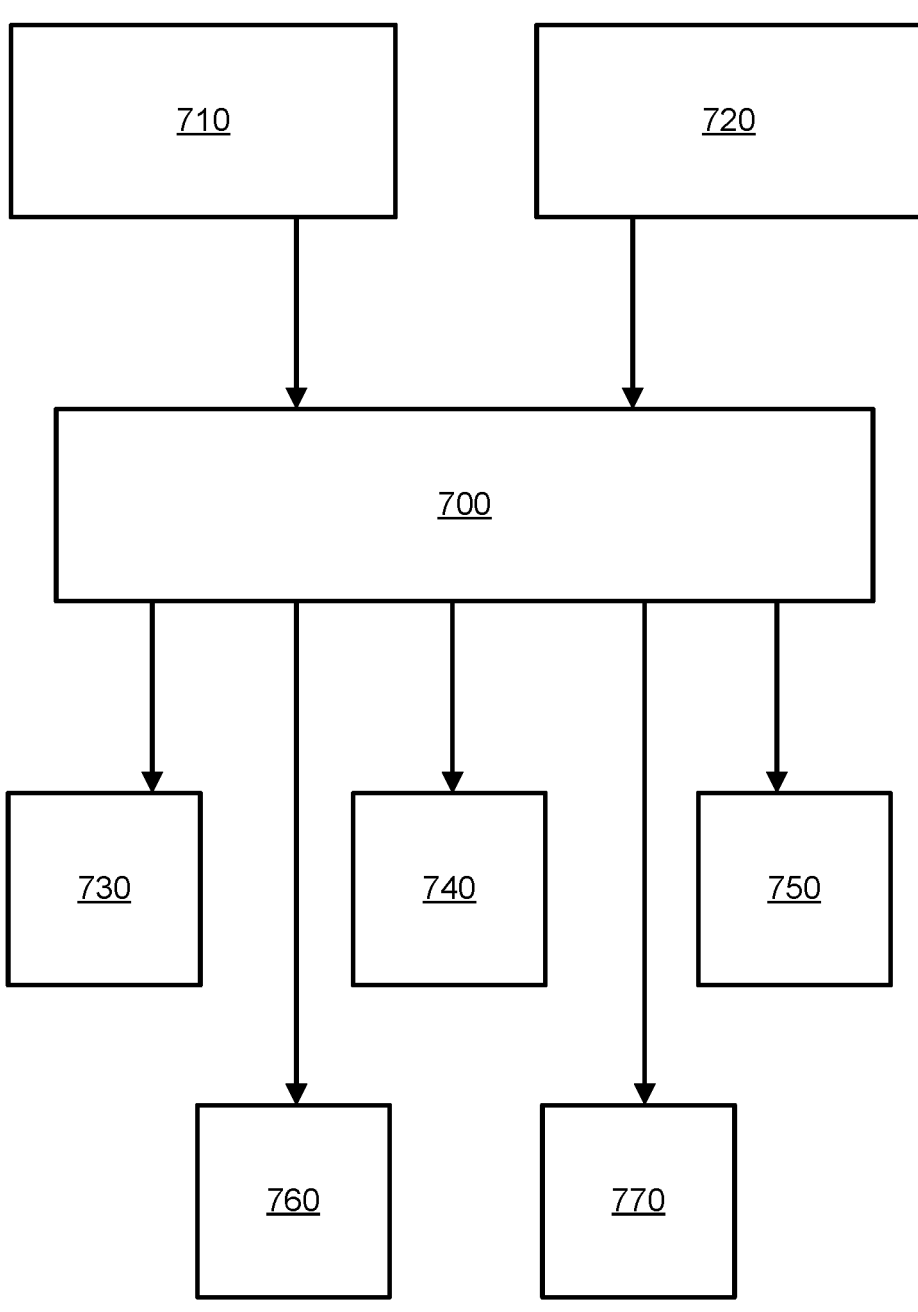
FIG. 7 is a functional block diagram of a control system for wafer transport system according to aspects of embodiments of the disclosed subject matter.

According to another aspect of an embodiment, FIG. 7 is a functional block diagram illustrating a control system for a lithographic apparatus including a utility stage. Controller 700 receives signals from a user interface 710 or an overall system controller 720. Through the user interface 710 a user can initiate a procedure in which the utility device is used or in which the utility stage loads a tool onto the utility device or unloads a tool from the utility device. The overall system controller 720 can also initiate such procedures, for example, with a set timing or in response to an indication that such procedures are required, for example, if excessive hot spots are detected on a wafer. The controller 700 provides control signals to a first wafer table positioner 730, a second wafer table positioner 740, a utility stage positioner 750, a utility device actuator 760, and a tool store actuator 770. The controller 700 ensures that the wafer tables and the utility stage move without interfering with each other. The controller 700 also can supply signals actuating the loading and unloading functions of the utility stage. Similarly, the controller 700 can supply signals controlling the loading and unloading of the utility device and of the tool store. It will be appreciated by one of ordinary skill the art that these functional divisions among components are arbitrary and that other divisions are possible.

The above description includes examples of multiple embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is construed when employed as a transitional word in a claim. Also, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

It is to be appreciated that the Detailed Description section, and not the Summary and Abstract sections, is intended to be used to interpret the claims. The Summary and Abstract sections may set forth one or more but not all exemplary embodiments of the present invention, and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions are appropriately performed.

The embodiments can be further described using the following clauses:

1. A photolithographic apparatus comprising:
an enclosure;

14 at least one object table situated in the enclosure and adapted to travel between a plurality of positions in the enclosure;
a utility device situated within the enclosure in a utility zone; and
a utility stage situated in the enclosure and adapted to travel from a parked position to the utility zone, the utility stage being adapted to carry at least one tool from the parked position to the utility zone.

2. A photolithographic apparatus as in clause 1 further comprising a tool store situated in the enclosure adjacent to the parked position and a plurality of tools stored in the tool store wherein the utility stage is adapted to unload a first tool from the tool store, convey the first tool to the utility device, and load the first tool on the utility device.

3. A photolithographic apparatus as in clause 2 wherein the object table comprises a wafer table, utility device comprises an object table cleaning tool situated at the utility position, and the first tool comprises a first cleaning stone.

4. A photolithographic apparatus as in clause 2 wherein the utility stage is further adapted to unload the first tool from the utility device, convey the first tool to the tool store, and load the first tool in the tool store.

5. A photolithographic apparatus as in clause 1 wherein the at least one object table comprises a first wafer table and a second wafer table.

6. A photolithographic apparatus as in clause 1 wherein the utility stage comprises an extensible robotic arm arranged to position the utility stage.

7. A photolithographic apparatus comprising:
an enclosure;
a first wafer table situated in the enclosure and adapted to move between a plurality of coplanar positions in the enclosure;
a second wafer table situated in the enclosure and adapted to move between the plurality of coplanar positions in the enclosure, the second wafer table being moved in such a way as to avoid interfering with motion of the first wafer table and the first wafer table being moved in such a way as to avoid interfering with motion of the second wafer table;
a utility device situated within the enclosure in a utility zone and adapted to perform a utility operation on a wafer; and
a utility stage situated in the enclosure and adapted to travel from a parked position to the utility zone, the utility stage being adapted to carry at least one tool from the parked position to the utility zone, the utility stage being moved and positioned in such a way as to avoid interfering with motion of the first wafer table and the second wafer table.

8. A photolithographic apparatus as in clause 7 further comprising a tool store situated in the enclosure adjacent to the parked position and a plurality of tools stored in the tool store wherein the utility stage is adapted to unload a first tool from the tool store, convey the first tool to the utility device, and load the first tool on the utility device.

9. A photolithographic apparatus as in clause 8 wherein the utility device comprises a wafer table cleaning tool situated in the utility zone and the first tool comprises a first cleaning stone.

10. A photolithographic apparatus as in clause 8 wherein the plurality of tools stored in the tool store comprises a plurality of cleaning stones.

11. A photolithographic apparatus as in clause 8 wherein the first tool comprises a sticky wafer and wherein the utility device comprises a wafer table cleaning tool adapted to press the sticky wafer against a wafer receiving surface of a wafer table.

12. A photolithographic apparatus as in clause 8 wherein the first tool comprises a spiked wafer and wherein the utility device comprises a wafer table cleaning tool adapted to press the spiked wafer against a wafer receiving surface of a wafer table.

13. A photolithographic apparatus as in clause 8 wherein the utility stage is further adapted to unload the first tool from the utility device, convey the first tool to the tool store, and load the first tool in the tool store.

14. A photolithographic apparatus as in clause 7 wherein the utility stage comprises an extensible robotic arm.

15. A method of operating a photolithographic apparatus, the photolithographic apparatus comprising an enclosure, a first wafer table situated in the enclosure and adapted to move between a plurality of coplanar positions in the enclosure, a second wafer table situated in the enclosure and adapted to between a plurality of coplanar positions in the enclosure, a utility device situated within the enclosure in a utility zone and adapted to perform a utility operation on a wafer, and a utility stage situated in the enclosure and adapted to travel from a parked position to the utility zone, the utility stage being adapted to carry at least one tool from the parked position to the utility zone, the method comprising:

situating the first wafer table at a first neutral position at which the first wafer table will not interfere with motion of the utility stage from the parked position to the utility zone;

situating the second wafer table at a second neutral position at which the second wafer table will not interfere with motion of the utility stage from the parked position to the utility zone; and moving the utility stage from the parked position to the utility device utility zone.

16. A method as in clause 15 wherein the utility stage unloads a tool from a tool store when the utility stage is at the parked position.

17. A method as in clause 16 wherein the first tool is one of a plurality of tools stored in the tool store.

18. A method as in clause 16 where the utility stage loads a tool onto a utility device when the utility stage is in the utility zone.

19. A method as in clause 18 wherein the utility stage unloads a tool from a tool store when the utility stage is at the parked position, moves to the utility zone, and loads the tool onto a utility device in the utility zone.

20. A method as in clause 16 further comprising:

using the utility stage to unload a first tool from the utility stage in the utility zone;

moving the utility stage to the parked position;

unloading the first tool from the utility stage and loading the first tool in a tool store;

unloading a second tool from the tool store and loading the second tool on the utility stage;

moving the utility stage to the utility zone; and using the utility stage to load the second tool onto the utility device.

21. A method as in clause 16 wherein the utility device comprises a wafer table cleaning tool situated in the utility zone and the first tool comprises a first cleaning stone.

22. A method as in clause 16 wherein the first tool comprises a sticky wafer and wherein the utility device comprises a wafer table cleaning tool adapted to press the sticky wafer against a wafer receiving surface of a wafer table.

23. A method as in clause 16 wherein the first tool comprises a spiked wafer and wherein the utility device comprises a wafer table cleaning tool adapted to press the spiked wafer against a wafer receiving surface of a wafer table.

24. A method as in clause 16 wherein the photolithographic apparatus comprises a lens and the first tool comprises a lens cleaning device, and wherein the utility stage is adapted to travel to the lens and deploy the lens cleaning device to clean the lens.

The invention claimed is:

1. A photolithographic apparatus comprising:

an enclosure;

at least one object table situated in the enclosure and adapted to travel between a plurality of positions in the enclosure;

a utility device situated within the enclosure in a utility zone;

a utility stage situated in the enclosure and adapted to travel from a parked position situated within the enclosure to the utility zone, the utility stage being adapted to carry at least one tool from the parked position to the utility zone; and a tool store situated in the enclosure adjacent to the parked position and a plurality of tools stored in the tool store.

2. A photolithographic apparatus as in claim 1 wherein:

the utility stage is adapted to unload a first tool from the tool store, convey the first tool to the utility device, and load the first tool on the utility device;

the object table comprises a wafer table, the utility device comprises an object table cleaning tool situated at the utility position, and the first tool comprises a first cleaning stone; and the utility stage is further adapted to unload the first tool from the utility device, convey the first tool to the tool store, and load the first tool in the tool store.

3. A photolithographic apparatus as in claim 1 wherein:

the at least one object table comprises a first wafer table and a second wafer table; and/or the utility stage comprises an extensible robotic arm arranged to position the utility stage.

4. A photolithographic apparatus comprising:

an enclosure;

a first wafer table situated in the enclosure and adapted to move between a plurality of coplanar positions in the enclosure;

a second wafer table situated in the enclosure and adapted to move between the plurality of coplanar positions in the enclosure, the second wafer table being moved in such a way as to avoid interfering with motion of the first wafer table and the first wafer table being moved in such a way as to avoid interfering with motion of the second wafer table;

a utility device situated within the enclosure in a utility zone and adapted to perform a utility operation on a wafer;

a utility stage situated in the enclosure and adapted to travel from a parked position situated within the enclosure to the utility zone, the utility stage being adapted to carry at least one tool from the parked position to the utility zone, the utility stage being moved and positioned in such a way as to avoid interfering with motion of the first wafer table and the second wafer table; and a tool store situated in the enclosure adjacent to the parked position and a plurality of tools stored in the tool store.

5. A photolithographic apparatus as in claim 4 wherein the utility stage is adapted to unload a first tool from the tool store, convey the first tool to the utility device, and load the first tool on the utility device.

6. A photolithographic apparatus as in claim 5 wherein:

the utility device comprises a wafer table cleaning tool situated in the utility zone and the first tool comprises a first cleaning stone;

the plurality of tools stored in the tool store comprises a plurality of cleaning stones; and the first tool comprises a sticky wafer and wherein the utility device comprises a wafer table cleaning tool adapted to press the sticky wafer against a wafer receiving surface of a wafer table.

7. A photolithographic apparatus as in claim 5 wherein:

the first tool comprises a spiked wafer and wherein the utility device comprises a wafer table cleaning tool adapted to press the spiked wafer against a wafer receiving surface of a wafer table; and the utility stage is further adapted to unload the first tool from the utility device, convey the first tool to the tool store, and load the first tool in the tool store.

8. A photolithographic apparatus as in claim 4 wherein the utility stage comprises an extensible robotic arm.

9. A method of operating a photolithographic apparatus, the photolithographic apparatus comprising an enclosure, a first wafer table situated in the enclosure and adapted to move between a plurality of coplanar positions in the enclosure, a second wafer table situated in the enclosure and adapted to between a plurality of coplanar positions in the enclosure, a utility device situated within the enclosure in a utility zone and adapted to perform a utility operation on a wafer, and a utility stage situated in the enclosure and adapted to travel from a parked position situated within the enclosure to the utility zone, the utility stage being adapted to carry at least one tool from the parked position to the utility zone, the method comprising:

situating the first wafer table at a first neutral position at which the first wafer table will not interfere with motion of the utility stage from the parked position to the utility zone;

situating the second wafer table at a second neutral position at which the second wafer table will not interfere with motion of the utility stage from the parked position to the utility zone; and moving the utility stage from the parked position to the utility device utility zone, wherein the utility stage unloads a tool from a tool store when the utility stage is at the parked position.

10. A method as in claim 9 wherein:

the first tool is one of a plurality of tools stored in the tool store;

the utility stage loads a tool onto a utility device when the utility stage is in the utility zone; and the utility stage unloads a tool from a tool store when the utility stage is at the parked position, moves to the utility zone, and loads the tool onto a utility device in the utility zone.

11. A method as in claim 9 further comprising:

using the utility stage to unload a first tool from the utility stage in the utility zone;

moving the utility stage to the parked position;

unloading the first tool from the utility stage and loading the first tool in a tool store;

unloading a second tool from the tool store and loading the second tool on the utility stage;

moving the utility stage to the utility zone; and using the utility stage to load the second tool onto the utility device.

12. A method as in claim 9 wherein:

the utility device comprises a wafer table cleaning tool situated in the utility zone and the first tool comprises a first cleaning stone; and the first tool comprises a sticky wafer and wherein the utility device comprises a wafer table cleaning tool adapted to press the sticky wafer against a wafer receiving surface of a wafer table.

13. A method as in claim 9 wherein the first tool comprises a spiked wafer and wherein the utility device comprises a wafer table cleaning tool adapted to press the spiked wafer against a wafer receiving surface of a wafer table.

14. A method as in claim 9 wherein the photolithographic apparatus comprises a lens and the first tool comprises a lens cleaning device, and wherein the utility stage is adapted to travel to the lens and deploy the lens cleaning device to clean the lens.

* * * * *